(12) United States Patent
Ishikawa

(10) Patent No.: US 12,227,380 B2
(45) Date of Patent: Feb. 18, 2025

(54) WIND-UP DRUM, TAPE FEEDER, AND COMPONENT MOUNTING MACHINE

(71) Applicant: FUJI CORPORATION, Chiryu (JP)

(72) Inventor: Kenzo Ishikawa, Kariya (JP)

(73) Assignee: FUJI CORPORATION, Chiryu (JP)

( * ) Notice: Subject to any disclaimer, the term of this patent is extended or adjusted under 35 U.S.C. 154(b) by 359 days.

(21) Appl. No.: 17/905,295

(22) PCT Filed: Mar. 3, 2020

(86) PCT No.: PCT/JP2020/008912
§ 371 (c)(1),
(2) Date: Aug. 30, 2022

(87) PCT Pub. No.: WO2021/176558
PCT Pub. Date: Sep. 10, 2021

(65) Prior Publication Data
US 2023/0127175 A1    Apr. 27, 2023

(51) Int. Cl.
*B65H 75/24*    (2006.01)
*B65H 18/10*    (2006.01)
*H05K 13/02*    (2006.01)

(52) U.S. Cl.
CPC ............. *B65H 18/10* (2013.01); *H05K 13/02* (2013.01)

(58) Field of Classification Search
CPC ........ B65H 18/10; B65H 75/12; B65H 75/14; B65H 75/24; B65H 75/28; B65H 75/30; H05K 13/02; H05K 13/0419
See application file for complete search history.

(56) References Cited

U.S. PATENT DOCUMENTS

| | | | |
|---|---|---|---|
| 5,992,791 A | 11/1999 | Tsuda et al. | |
| 6,379,098 B1* | 4/2002 | Shibasaki | H05K 13/0419 156/941 |
| 2012/0018566 A1* | 1/2012 | Hsu | B65H 75/2272 242/608.2 |

FOREIGN PATENT DOCUMENTS

| | | |
|---|---|---|
| EP | 0 897 258 A2 | 2/1999 |
| JP | 1-203147 A | 8/1989 |
| JP | 5-17067 A | 1/1993 |
| JP | 6-61687 A | 3/1994 |

(Continued)

OTHER PUBLICATIONS

International Search Report Issued Jun. 2, 2020, in PCT/JP2020/008912, filed on Mar. 3, 2020, 2 pages.

*Primary Examiner* — Sang K Kim
(74) *Attorney, Agent, or Firm* — Oblon, McClelland, Maier & Neustadt, L.L.P.

(57) ABSTRACT

There are provided a wind-up drum that is easily detached in a state in which a wound tape is fastened, a tape feeder including the wind-up drum, and a component mounting machine capable of mounting the tape feeder. A wind-up drum includes a tape holding member including an insertion hole for inserting a support shaft of a rotating device and configured to hold a wound tape, and a wound member attached to the tape holding member, configured to wind up the tape by rotating the support shaft by the rotating device in a state in which the support shaft is mounted, and including a rotating member that rotates in contact with the support shaft when the wound member is detached from the support shaft in a state in which the tape is wound.

9 Claims, 10 Drawing Sheets

(56) References Cited

FOREIGN PATENT DOCUMENTS

| | | |
|---|---|---|
| JP | 9-2743 A | 1/1997 |
| JP | 2004-296951 A | 10/2004 |

* cited by examiner

BASE END SIDE ← AXIAL DIRECTION → DISTAL END SIDE

WIND-UP DRUM, TAPE FEEDER, AND COMPONENT MOUNTING MACHINE

TECHNICAL FIELD

The present disclosure relates to a wind-up drum for winding a tape, a tape feeder including the wind-up drum, and a component mounting machine capable of mounting the tape feeder.

BACKGROUND ART

Conventionally, various wind-up drums for winding a tape have been proposed. For example, the wind-up reel of Patent Literature 1 winds the cover tape of a component supply tape used in an electronic component supply device. A component supply tape includes a carrier tape for accommodating electronic components at predetermined intervals and a cover tape attached to the surface of the carrier tape to block the accommodation section of the electronic components. The wind-up reel is mounted on a tape wind-up device that supplies electronic components one by one from a component supply tape. The tape wind-up device peels the cover tape from the carrier tape, and winds the peeled cover tape around the wind-up reel.

PATENT LITERATURE

Patent Literature 1: JP-A-H9-2743

BRIEF SUMMARY

Technical Problem

When the cover tape is peeled from the carrier tape and wound, the wind-up reel applies a certain tension to the cover tape to wind the cover tape while peeling the cover tape from the carrier tape. Therefore, the cover tape may be fastened to the wind-up reel. When attempting to detach the wind-up reel from the tape wind-up device when discarding the cover tape, it is difficult to detach the wind-up reel due to the fastened cover tape.

The present disclosure has been made in view of such circumstances, and it is an object of the present disclosure to provide a wind-up drum that is easily detachable even if a wound tape is fastened, a tape feeder including the wind-up drum, and a component mounting machine for mounting the tape feeder.

To address these challenges, the present disclosure discloses a wind-up drum including a tape holding member including an insertion hole for inserting a support shaft of a rotating device and configured to hold a wound tape, and a wound member attached to the tape holding member and configured to wind up the tape by rotating the support shaft by the rotating device in a state in which the support shaft is mounted and including a rotating member that rotates in contact with the support shaft when the wound member is detached from the support shaft in a state in which the tape is wound.

In addition, the content of the present disclosure is extremely effective not only when implemented as a wind-up drum, but also when implemented as a tape feeder for mounting the wind-up drum or a component mounting machine for mounting the tape feeder.

Advantageous Effects

According to a wind-up drum and a tape feeder of the present disclosure, a tape is wound around a wound member by rotating a support shaft by a rotating device. The wound member is provided with the rotating member that comes into contact with the support shaft. The rotating member rotates in contact with the support shaft when the wind-up drum is detached from the support shaft in a state in which the tape is wound. As a result, even if the tape is fastened to the wound member and the wound member is fastened to the support shaft by the tape, the wind-up drum can be easily moved smoothly with respect to the support shaft by rotating the rotating member. Therefore, the wind-up drum can be easily detached from the support shaft.

DESCRIPTION OF EMBODIMENTS

Figure 1:
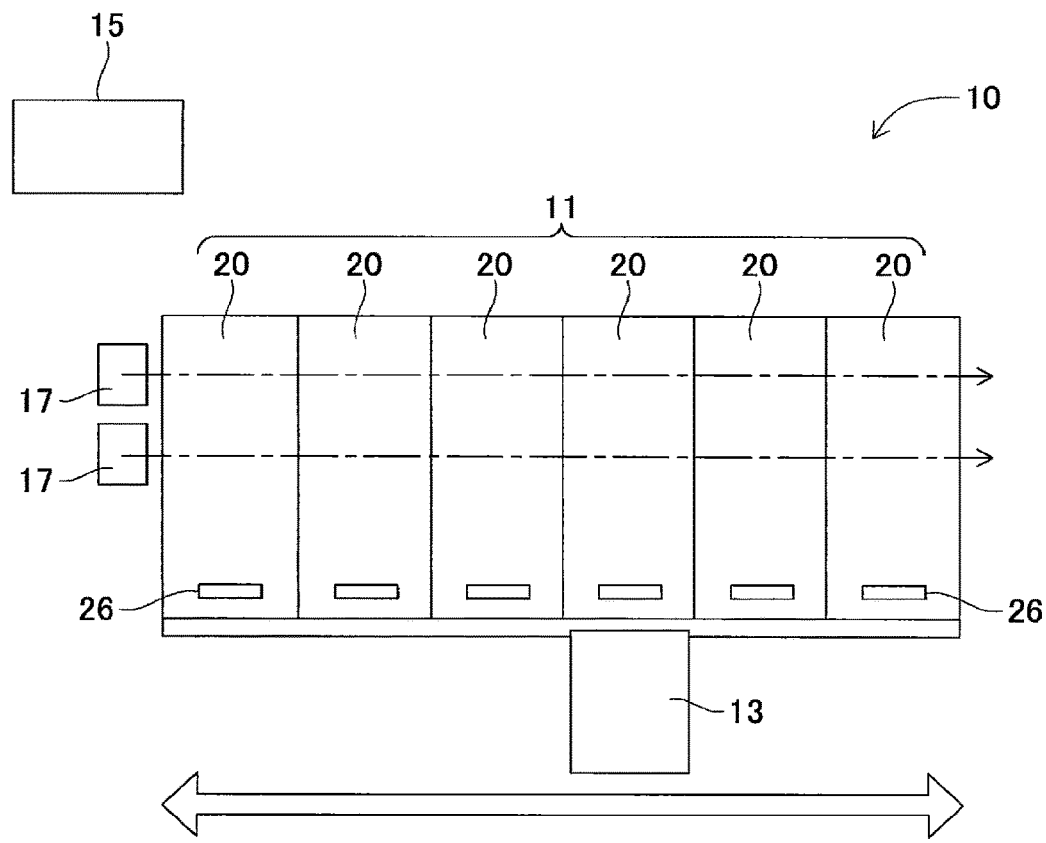
FIG. 1 is a plan view illustrating a schematic configuration of a component mounting system according to the present embodiment.
Figure 2:
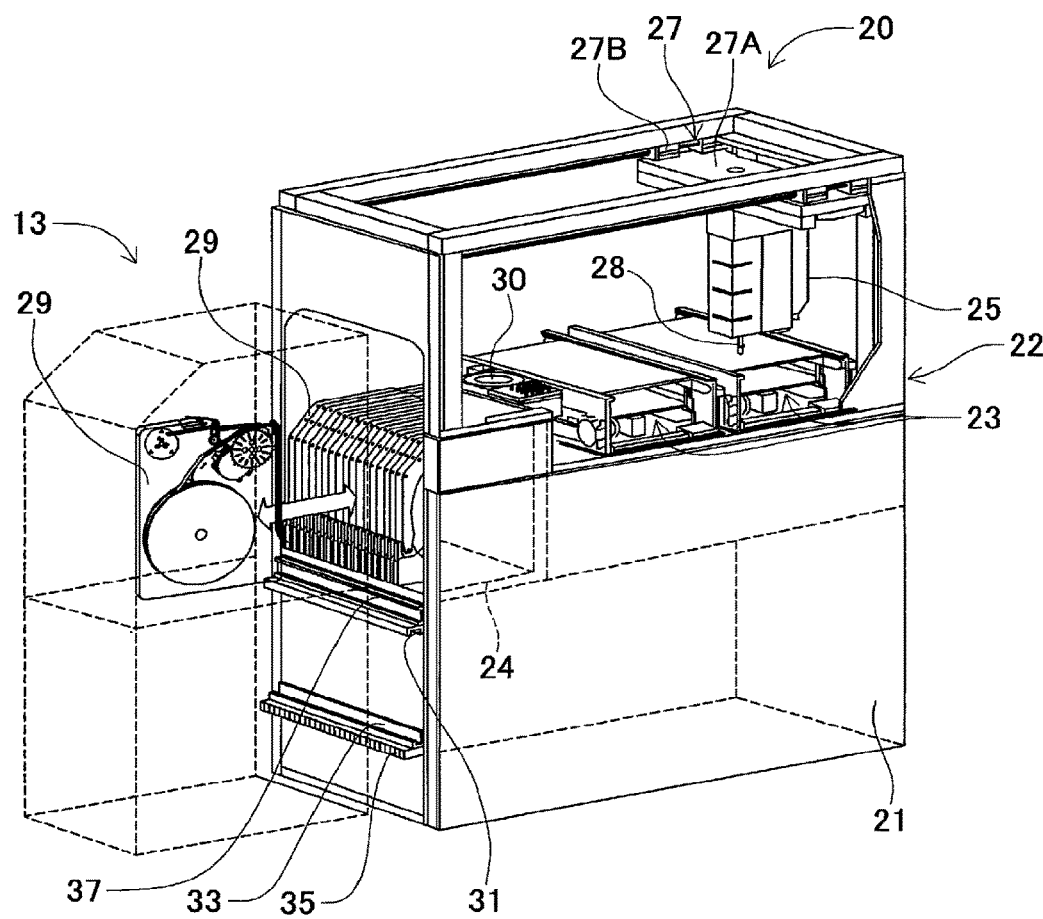
FIG. 2 is a perspective view illustrating a schematic configuration of a component mounting machine and a loader.
Figure 2:
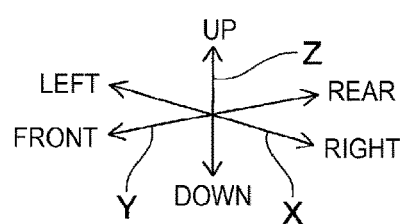

Hereinafter, an embodiment of the present disclosure will be described with reference to drawings. FIG. 1 is a plan view illustrating a schematic configuration of component mounting system 10 of the present embodiment. FIG. 2 is a perspective view illustrating a schematic configuration of component mounting machine 20 and loader 13. In the following description, the left-right direction in FIG. 1 is referred to as an X direction, the front-rear direction is referred to as the Y direction, and the direction perpendicular to the X direction and the Y direction is referred to as a Z direction (up-down direction).

As illustrated in FIG. 1, component mounting system 10 includes production line 11, loader 13, and management computer 15. Production line 11 includes multiple component mounting machine 20 aligned in the X direction, and mounts an electronic component on board 17. For example, board 17 is conveyed from left-side component mounting machine 20 to right-side component mounting machine 20 illustrated in FIG. 1, and an electronic component is mounted on board 17 while the board is conveyed.

As illustrated in FIG. 2, component mounting machine 20 includes base 21 and module 22. Base 21 has a substantially rectangular box shape that is long in the Y direction and is placed on a floor or the like of a factory in which component mounting machine 20 is installed. The position of base 21 is, for example, adjusted in the up-down direction to align the position of board conveyance device 23 of adjacent module 22, and is fixed to base 21 of adjacent component mounting machine 20. Module 22 is a device for mounting or the like an electronic component on board 17 and is placed on base 21. Module 22 can be pulled out toward the front side in the front-rear direction with respect to base 21, and can be replaced with another module 22.

Module 22 includes board conveyance device 23, pallet 24, head section 25, and head moving mechanism 27. Board conveyance device 23 is provided in module 22 and conveys board 17 in the X direction. Board conveyance device 23 includes a conveyor belt that conveys board 17, an electromagnetic motor as a driving source for rotating the conveyor belt, and the like.

Pallet 24 is provided on the front surface of module 22 and is a table having an L-shaped side view. Pallet 24 includes multiple slots (not illustrated) arranged in the X direction. Tape feeder 29 for supplying electronic components is mounted in each slot of pallet 24. Tape feeder 29 supplies electronic components from, for example, a component supply tape that accommodates electronic components at predetermined pitches. Details of tape feeder 29 will be described later. As illustrated in FIG. 1, touch panel 26 for inputting an operation to component mounting machine 20 is provided on the upper cover of module 22. FIG. 2 illustrates a state in which the upper cover and touch panel 26 are detached.

Head section 25 includes suction nozzle 28 that picks up electronic components supplied from tape feeder 29, and mounts the electronic components picked up by suction nozzle 28 on board 17. Head section 25 includes, for example, an electromagnetic motor (not illustrated) as a driving source for changing the positions of multiple suction nozzles 28 and the positions of individual suction nozzles 28. Head moving mechanism 27 moves head section 25 to any position in the X direction and the Y direction in the upper portion of module 22. Specifically, head moving mechanism 27 includes X-axis slide mechanism 27A for moving head section 25 in the X direction, and Y-axis slide mechanism 27B for moving head section 25 in the Y direction. X-axis slide mechanism 27A is attached to Y-axis slide mechanism 27B.

Y-axis slide mechanism 27B includes a linear motor (not illustrated) as a driving source. X-axis slide mechanism 27A moves to any position in the Y direction based on the drive of the linear motor of Y-axis slide mechanism 27B. In addition, X-axis slide mechanism 27A includes a linear motor (not illustrated) as a driving source. Head section 25 is attached to X-axis slide mechanism 27A, and moves to any position in the X direction based on the drive of the linear motor of X-axis slide mechanism 27A. Therefore, head section 25 moves to any position in the upper portion of module 22 as X-axis slide mechanism 27A and Y-axis slide mechanism 27B are driven.

A mark camera (not illustrated) for capturing an image of board 17 is provided in head section 25. In addition, in module 22, part camera 30 is provided between pallet 24 and board conveyance device 23 in the front-rear direction (refer to FIG. 2). Part camera 30 is installed in a state of facing upward, and captures an image of the electronic component picked up and held by suction nozzle 28.

As illustrated in FIG. 2, upper guide rail 31, lower guide rail 33, rack gear 35, and non-contact power supply coil 37 are provided on the front surface of base 21. Upper guide rail 31 is a rail having a U-shaped cross section extending in the X direction, and the opening section faces downward. Lower guide rail 33 is a rail having an L-shaped cross section extending in the X direction, the vertical surface is attached to the front surface of base 21, and the horizontal surface extends forward. Rack gear 35 is a gear provided in the lower portion of lower guide rail 33, extending in the X direction, and having multiple vertical grooves engraved on the front surface. Upper guide rail 31, lower guide rail 33, and rack gear 35 of base 21 can be detachably coupled to upper guide rail 31, lower guide rail 33, and rack gear 35 of adjacent base 21. Therefore, in component mounting machine 20, the number of component mounting machines 20 aligned in production line 11 can be increased or decreased. Non-contact power supply coil 37 is a coil disposed in the upper portion of upper guide rail 31 and disposed along the X direction, and supplies power to loader 13.

Loader 13 is a device that automatically replenishes and collects tape feeder 29 to component mounting machine 20, and includes a gripping section (not illustrated) for clamping tape feeder 29. Loader 13 is provided with an upper roller (not illustrated) inserted into upper guide rail 31 and a lower roller (not illustrated) inserted into lower guide rail 33. Further, loader 13 is provided with a motor as a driving source. A gear that meshes with rack gear 35 is attached to the output shaft of the motor. Loader 13 includes a power receiving coil that receives the power supplied from non-contact power supply coil 37 of component mounting machine 20. Loader 13 supplies the power received from non-contact power supply coil 37 to the motor. As a result, loader 13 can move in the X direction (the left-right direction) by rotating the gear by the motor. Further, loader 13 can rotate the rollers in upper guide rail 31 and lower guide rail 33 to move in the X direction while maintaining the positions in the up-down direction and the front-rear direction.

Management computer 15 illustrated in FIG. 1 is a device for collectively managing component mounting system 10. For example, management computer 15 is connected to each component mounting machine 20 of production line 11 by a wired LAN or a wireless LAN. The component mounting machine 20 initiates the electronic component mounting operation based on the management of management computer 15. Component mounting machine 20 causes head section 25 to perform the electronic component mounting operation while conveying board 17. In addition, management computer 15 monitors the number of remaining electronic components of tape feeder 29. For example, when determining that tape feeder 29 needs to be replenished, management computer 15 displays an instruction to set tape feeder 29 accommodating the component type requiring replenishment in loader 13 on the screen. A user confirms the screen to set tape feeder 29 on loader 13. When detecting that desired tape feeder 29 is set in loader 13, management computer 15 instructs loader 13 to initiate the replenishment operation. Loader 13 moves to the front of component mounting machine 20 instructed, holds tape feeder 29 set by the user between the gripping sections, and mounts tape feeder 29 in the slot of pallet 24. As a result, new tape feeder 29 is replenished to component mounting machine 20. Further, loader 13 holds tape feeder 29 with component shortage, between the gripping sections and pulls tape feeder 29 out from pallet 24 for collection. In this manner, it is possible to automatically replenish new tape feeder 29 and collect tape feeder 29 with component shortage by loader 13.

Figure 3:
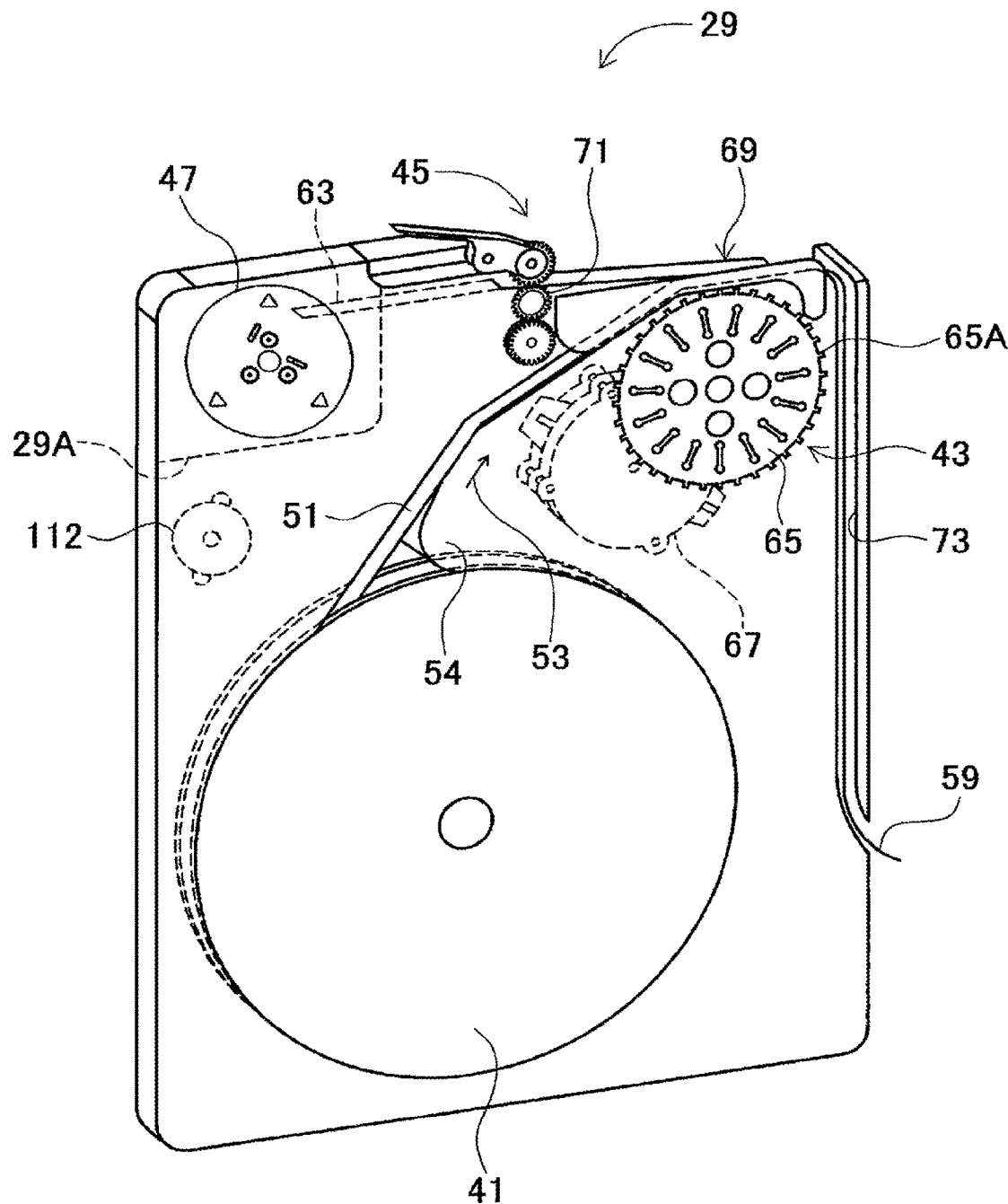
FIG. 3 is a perspective view illustrating a tape feeder.

Next, the details of tape feeder 29 will be described. FIG. 3 illustrates a perspective view of tape feeder 29. As illustrated in FIG. 3, tape feeder 29 includes reel 41, feed device 43, peeling device 45, and wind-up drum 47. Tape feeder 29 supplies electronic components at an end portion of the upper surface. Specifically, component supply tape 51 is wound around reel 41. Component supply tape 51 is pulled out from reel 41 onto tape guide 54 along conveyance direction 53.

Figure 4:
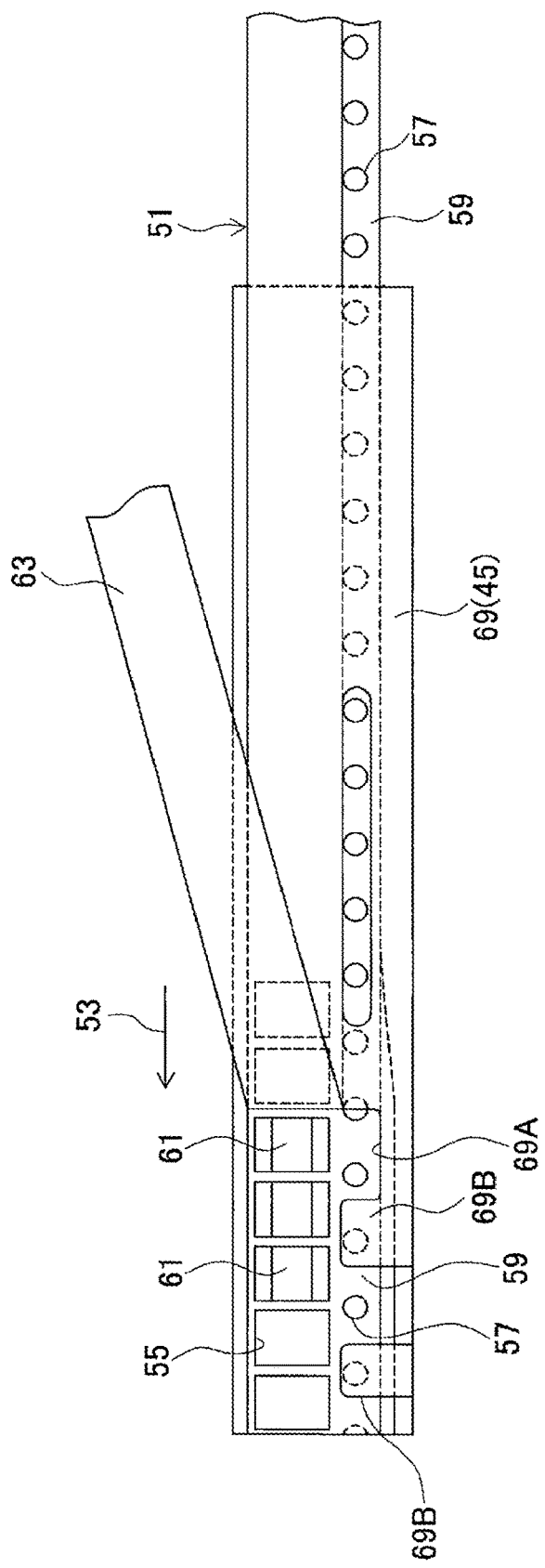
FIG. 4 is a plan view of a distal end portion of the tape feeder.

FIG. 4 illustrates the distal end portion of tape feeder 29 in conveyance direction 53. As illustrated in FIG. 4, component supply tape 51 includes carrier tape 59 and cover tape 63 attached to carrier tape 59. Component accommodation sections 55 are formed on carrier tape 59 at predetermined intervals along conveyance direction 53, and component accommodation section 55 accommodates electronic component 61. Cover tape 63 is attached to the upper surface of carrier tape 59. Component accommodation section 55 is formed of a recessed section having an open upper portion, and the opening of the upper portion is closed by cover tape 63. Accordingly, component supply tape 51 is a tape in which electronic components are taped.

In carrier tape 59, feeding holes 57 are formed at predetermined intervals (at equal pitches) along conveyance direction 53. As illustrated in FIG. 3, feed device 43 includes sprocket 65 having a substantially disk shape, and electromagnetic motor 67 serving as a driving source. Protrusions 65A are formed on the outer peripheral portion of sprocket 65 at predetermined intervals in the circumferential direction. Protrusion 65A of sprocket 65 is engaged with feeding hole 57 of component supply tape 51. The output shaft of electromagnetic motor 67 is coupled to sprocket 65 by a gear or the like. Accordingly, sprocket 65 rotates based on the drive of electromagnetic motor 67, and feeds component supply tape 51 in a state in which cover tape 63 is attached to carrier tape 59. Sprocket 65 feeds component supply tape 51 in conveyance direction 53 at the upper end surface of tape feeder 29.

As illustrated in FIGS. 3 and 4, peeling device 45 includes frame 69 and gear mechanism 71. Frame 69 is provided at the distal end portion of the upper surface of tape feeder 29. Frame 69 is formed in a thin plate shape extending in conveyance direction 53 in accordance with the shape of component supply tape 51. Opening 69A is formed in the upper portion of the distal end of frame 69 in conveyance direction 53 to match the supply position of electronic component 61.

Wind-up drum 47 is disposed above reel 41 and behind (upstream side of) sprocket 65 in conveyance direction 53. Although the details will be described later, wind-up drum 47 winds cover tape 63 by rotating. Wind-up drum 47 is attached to support member 111 (refer to FIG. 5) provided on tape feeder 29. In addition, tape feeder 29 is provided with electromagnetic motor 112 as a driving source for rotating support member 111. An output shaft of electromagnetic motor 112 is coupled to support member 111 by a gear or the like. Support member 111 rotates based on the drive of electromagnetic motor 112. As a result, wind-up drum 47 rotates in accordance with the rotation of support member 111 to wind cover tape 63. In addition, door portion 29A that can be opened and closed in accordance with the attaching position of wind-up drum 47 is formed on tape feeder 29. By opening and closing door portion 29A, the user can attach wind-up drum 47 to support member 111 or detach wind-up drum 47 after cover tape 63 is wound. Electromagnetic motor 112 for rotating support member 111 (wind-up drum 47) and electromagnetic motor 67 for rotating sprocket 65 may be the same (commonly used) electromagnetic motor. That is, wind-up drum 47 may be rotated by electromagnetic motor 67 that rotates sprocket 65. In this case, tape feeder 29 may not include a dedicated driving source (electromagnetic motor 112) for rotating support member 111. The method of rotating wind-up drum 47 is not limited to the method of rotating support member 111 by electromagnetic motor 112. For example, a force in the rotational direction (winding direction) may be applied to wind-up drum 47 by a spring or the like to rotate wind-up drum 47. In addition, wind-up drum 47 may be driven to rotate by rotating gear mechanism 71 described later.

Gear mechanism 71 is disposed between wind-up drum 47 and frame 69, and feeds (draws) cover tape 63 from frame 69 to wind-up drum 47. By pulling the distal end side of cover tape 63 by wind-up drum 47, cover tape 63 engages with a part of opening 69A of frame 69 and is peeled off from carrier tape 59. In other words, when cover tape 63 is wound from carrier tape 59, wind-up drum 47 applies a constant tension to cover tape 63 to wind cover tape 63. Electronic component 61 accommodated in component accommodation section 55 is exposed in opening 69A (the upper surface is opened) in response to the feed of component supply tape 51. According to such a structure, component supply tape 51 supplies electronic component 61 at opening 69A. Head section 25 picks up electronic component 61 by suction nozzle 28 (refer to FIG. 2) from component accommodation section 55 released in opening 69A. That is, the position at which opening 69A is exposed is a position at which electronic components of tape feeder 29 are supplied.

As illustrated in FIG. 4, frame 69 includes multiple claw sections 69B that are disposed on the upper portion of carrier tape 59 after cover tape 63 is peeled off on the distal end side of opening 69A. Multiple claw sections 69B are disposed above feeding hole 57 side of carrier tape 59, and engage when carrier tape 59 moves upward to regulate the upward movement of carrier tape 59. As illustrated in FIG. 3, tape guide passage 73 is formed on the side face of tape feeder 29 on the downstream (distal end) side in conveyance direction 53 to be directed downward. After electronic component 61 is picked up, carrier tape 59 is discharged through tape guide passage 73, cut by, for example, a cutter provided in pallet 24, and collected in a dust box.

Figure 8:
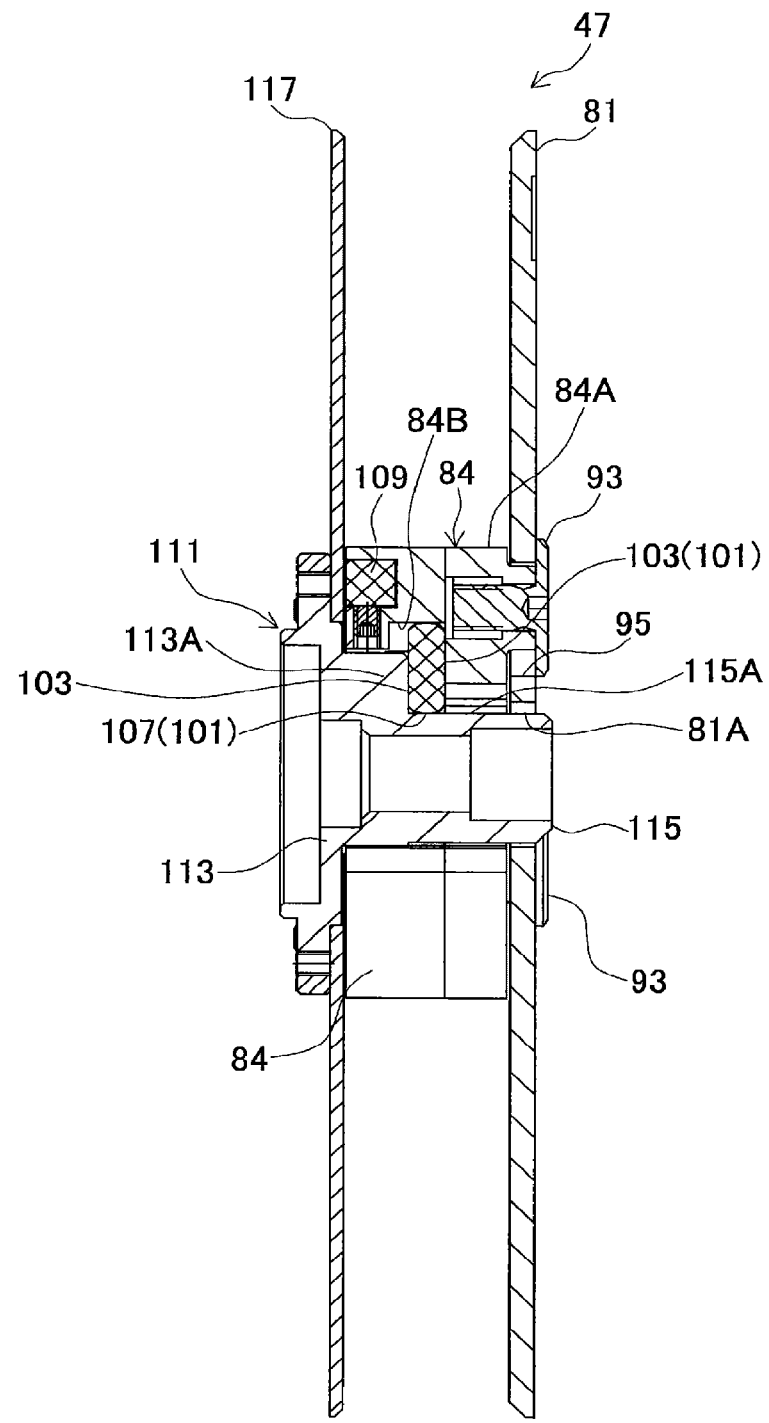
FIG. 8 is a sectional view of the support member and the wind-up drum taken along a plane along an axial direction.

Next, the details of wind-up drum 47 will be described. As illustrated in FIGS. 5 to 8, wind-up drum 47 includes tape holding member 81 and core section 83. In addition, support member 111 for mounting and supporting wind-up drum 47 is provided at the mounting position of wind-up drum 47 in tape feeder 29. In the following description, as illustrated in FIG. 8, the axial direction of support member 111 will be used.

Tape holding member 81 of wind-up drum 47 is formed in a disk shape of a thin plate. Insertion hole 81A for inserting support member 111 is formed in the center of tape holding member 81. Insertion hole 81A has a circular cross-section and is formed so as to penetrate plate-shaped tape holding member 81 in the axial direction. Core section 83 is provided at the center portion of tape holding member 81 so as to surround insertion hole 81A. The shape of tape holding member 81 is not particularly limited as long as tape holding member 81 can hold cover tape 63 wound around core section 83. For example, tape holding member 81 may have an oval or polygonal plate shape, or may be configured by multiple plates or rods extending in the radial direction from the rotational center (in a shape other than the plate shape).

Cover tape 63 is wound around core section 83. Core section 83 is formed in a substantially cylindrical shape (a cylinder with a hole) surrounding insertion hole 81A when wind-up drum 47 is viewed in plan view. Core section 83 includes multiple wound members 84 (three in the present embodiment). In other words, core section 83 is divided into three wound members 84. Three core sections 83 have the same shape and structure. Three wound members 84 may have different structures (for example, a structure in which rotating member 101 described later is not provided).

Figure 6:
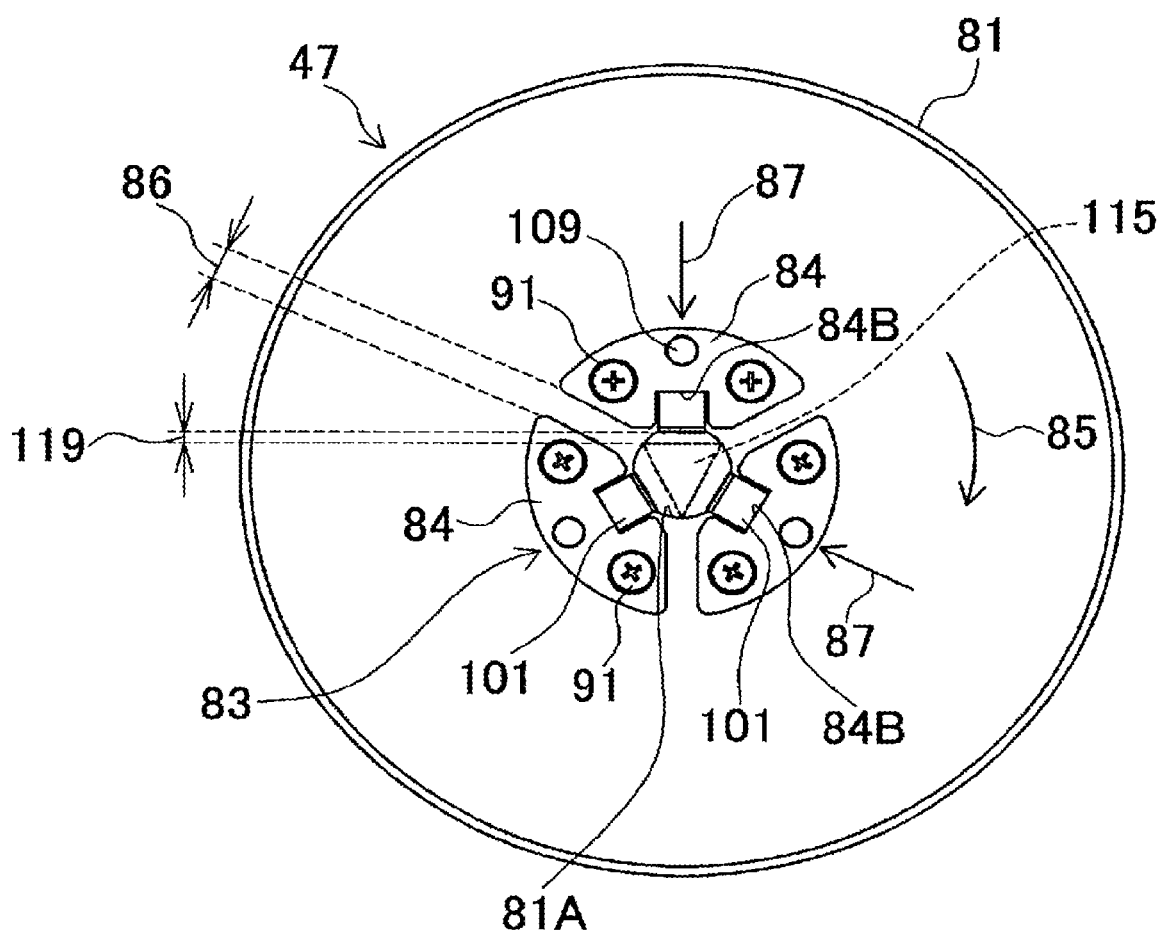
FIG. 6 is a plan view illustrating an inner side of the wind-up drum.
Figure 7:
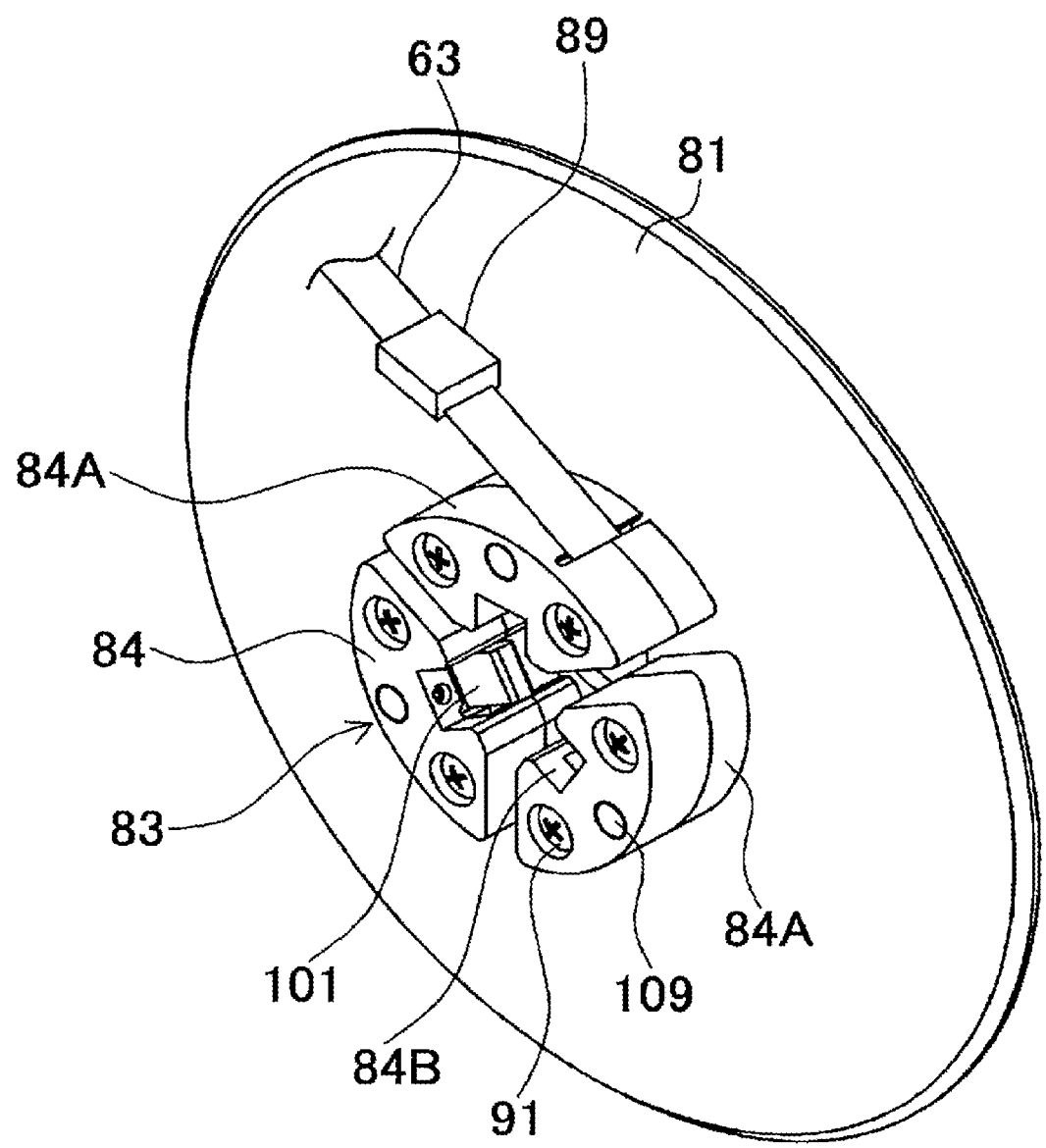
FIG. 7 is a perspective view illustrating the inner side of the wind-up drum.

Wound member 84 has a substantially fan shape in plan view of wind-up drum 47, and has a predetermined thickness in the axial direction. In the direction of winding cover tape 63 around wind-up drum 47, that is, circumferential direction 85 in the rotational direction of wind-up drum 47, three wound members 84 are disposed at equal intervals with predetermined interval 86 therebetween. Outer circumferential surface 84A (refer to FIG. 7) on an outer side in radial direction 87 indicated by arrows in FIG. 6 is formed of a surface curved along circumferential direction 85. Radial direction 87 is, for example, a radial direction of disk-shaped tape holding member 81. Cover tape 63 is wound around outer circumferential surface 84A of wound member 84 and stacked in radial direction 87. Wind-up drum 47 applies a constant tension to cover tape 63 when cover tape 63 is wound from carrier tape 59. Therefore, wound cover tape 63 applies a tightening force to wound member 84 (core section 83) on the inner side in radial direction 87.

Extension member 89 (refer to FIG. 7) is attached to one of three wound members 84. Extension member 89 is a member for attaching the distal end of cover tape 63 to wind-up drum 47. Wound member 84 is divided into two members in the axial direction, and the two members divided by screw 91 are fixed to each other. Wound member 84 can attach the distal end portion of extension member 89 to the inside of the two members by detaching screw 91. Wound member 84 is rotated by support member 111 to wind cover tape 63 attached to extension member 89 around outer circumferential surface 84A.

Wound member 84 is attached to tape holding member 81 by metal fitting 93. Metal fitting 93 is inserted into slide groove 95 (refer to FIG. 8) formed in tape holding member 81, and holds wound member 84 to be slidable in slide groove 95. In addition, wound member 84 is formed with regulating protruding sections 97 (refer to FIG. 5). Regulating protruding section 97 protrudes in the axial direction and is inserted into slide groove 99 formed in tape holding member 81. As a result, each of three wound members 84 is held by tape holding member 81 by metal fitting 93 and regulating protruding section 97, and is allowed to slide and move along radial direction 87.

In addition, rotating member 101 is attached to each of three wound members 84. Rotating member 101 is, for example, a member made of metal, is accommodated in accommodation section 84B of wound member 84, and is rotatable about a rotation axis along a direction orthogonal to the axial direction (direction orthogonal to the paper surface in FIG. 8). For example, rotating member 101 is provided in accommodation section 84B at the inner end portion of radial direction 87 as the center portion of wound member 84 in a fan shape in circumferential direction 85.

Rotating member 101 is formed, for example, in a plate shape having a predetermined thickness in the axial direction of support member 111 in the mounted state illustrated in FIG. 8, and includes a pair of flat surfaces 103 facing each other in the thickness direction. In addition, support member 111 includes a pair of curved surfaces 107 that face each other in a direction orthogonal to the thickness direction in which flat surfaces 103 face each other. Each of the curved ends of curved surface 107 is connected to each of the pair of flat surfaces 103. As illustrated in FIG. 8, a cross section obtained by cutting rotating member 101 in a plane along the axial direction in a state in which wind-up drum 47 is mounted on support member 111 has a shape in which the pair of flat surfaces 103 are opposed in the axial direction and the pair of curved surfaces 107 are opposed in a direction orthogonal to the axial direction (the up-down direction in FIG. 8). In other words, when a sphere formed with a predetermined curvature along curved surface 107 is assumed, the sectional shape of rotating member 101 has a shape in which the sphere is notched by flat surface 103 along the direction orthogonal to the axial direction (the up-down direction in FIG. 8). The shape of rotating member 101 illustrated in FIGS. 5 to 8 is an example.

Figure 5:
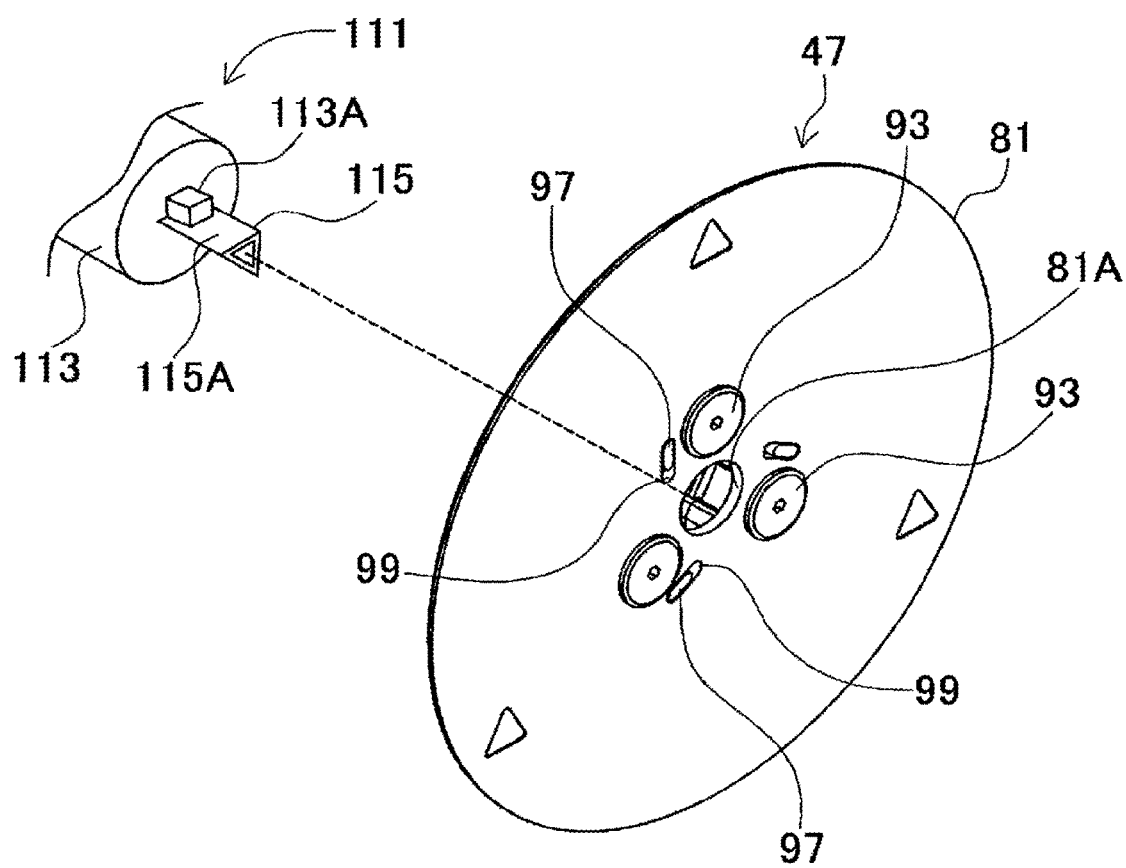
FIG. 5 is a perspective view illustrating a state in which a wind-up drum is detached from a support member.

On the other hand, support member 111 includes pedestal member 113, support shaft 115, and metal plate 117. In FIG. 5, illustration of metal plate 117 is omitted. Pedestal member 113 is formed at the base end portion of support shaft 115 in the axial direction, and supports the base end portion of support shaft 115 at a predetermined position. Pedestal member 113 rotates based on a drive force transmitted from electromagnetic motor 112 (refer to FIG. 3) of tape feeder 29, and integrally rotates with support shaft 115 and metal plate 117.

Support shaft 115 is a columnar member extending in the axial direction, and the base end portion thereof is fixed to pedestal member 113. Support shaft 115 has a substantially triangular prism shape surrounded by three outer circumferential surfaces 115A formed in a plane (refer to FIGS. 5 and 6). In a state in which wind-up drum 47 is mounted on support member 111, support shaft 115 is inserted into insertion hole 81A of tape holding member 81.

Each of three wound members 84 is provided with magnet 109 on the inner side (base end side) in the axial direction. Magnet 109 is provided, for example, at the center portion of wound member 84 having a fan shape in circumferential direction 85 on the outer side in radial direction 87. Accordingly, magnet 109 is provided at a position moved from rotating member 101 on the outer side in radial direction 87. Metal plate 117 is, for example, a plate of a disk-shaped metal (such as iron) that surrounds pedestal member 113. Metal plate 117 is, for example, a disk having the same radius as tape holding member 81. As illustrated in FIG. 8, in a state in which wind-up drum 47 is mounted on support shaft 115, magnet 109 is attracted to metal plate 117 by a magnetic attraction force. As a result, the rotational position of wind-up drum 47 with respect to support member 111 in circumferential direction 85 is maintained.

In addition, protruding section 113A is formed on the base end portion of outer circumferential surface 115A of pedestal member 113. Protruding section 113A protrudes from pedestal member 113 toward the distal end side in the axial direction, and comes into contact with rotating member 101 when wind-up drum 47 is mounted. In other words, protruding section 113A is formed at a position that comes into contact with rotating member 101 in circumferential direction 85 when wind-up drum 47 is mounted. Protruding section 113A comes into contact with flat surface 103 of rotating member 101 in the axial direction (flat surface 103 on the base end portion side) with a plane such that rotating member 101 is rotated to the state illustrated in FIG. 8. Accordingly, protruding section 113A rotates rotating member 101 to rotate rotating member 101 to a predetermined mounting position (the state illustrated in FIG. 8).

Next, an operation when wind-up drum 47 is attached to support member 111 will be described. First, wind-up drum 47 is detached from support member 111 such that wound member 84 is freely movable in radial direction 87 in a state in which cover tape 63 is not wound. Wound member 84 moves to any position in accordance with the rotational position, the weight of wound member 84, the weight of extension member 89, and the like.

Next, when wind-up drum 47 is attached to support member 111, in wind-up drum 47, support shaft 115 is inserted into insertion hole 81A and moved from the distal end side to the base end side along the axial direction. At this time, support shaft 115 is inserted into wind-up drum 47 in a state in which each outer circumferential surface 115A of support shaft 115 is disposed (adjusted) at a position facing rotating member 101 in circumferential direction 85 (refer to FIG. 6). In the present embodiment, the sliding range of wound member 84 is set so that gap 119 (refer to FIG. 6) is formed between rotating member 101 and outer circumferential surface 115A in radial direction 87 when wound member 84 is slid toward the outermost side of radial direction 87. That is, the positions and lengths of slide groove 95 and slide groove 99 are set so that gap 119 is formed between rotating member 101 and support shaft 115 when wind-up drum 47 is mounted. As a result, when wind-up drum 47 is attached to support member 111, gap 119 can be provided between wound member 84 and outer circumferential surface 115A, and wind-up drum 47 can be easily mounted on support shaft 115. The sliding range of wound member 84 may be adjusted so that gap 119 is not formed between outer circumferential surface 115A and wound member 84.

When support shaft 115 is inserted into insertion hole 81A and moved along the axial direction of wind-up drum 47, rotating member 101 comes into contact with protruding section 113A. Rotating member 101 rotates from a state of being inclined to a certain rotational position to a state in which flat surface 103 on the base end side is in surface contact with protruding section 113A (rotational position of flat surface 103 illustrated in FIG. 8 along the up-down direction).

Accordingly, when wind-up drum 47 is mounted on support shaft 115, pedestal member 113 of the present embodiment comes into contact with rotating member 101 to rotate rotating member 101 to a predetermined mounting position. According to this configuration, it is possible to suppress the deviation of the mounting position (rotational position) of rotating member 101 every time rotating member 101 is mounted, and to accurately dispose rotating member 101 at a predetermined mounting position.

In addition, as illustrated in FIG. 8, for example, rotating member 101 brings curved surface 107 on the outer side in radial direction 87 into contact with the inner wall of accommodation section 84B (the inner wall inside in radial direction 87). When the inner wall of wound member 84 is pushed by curved surface 107, wound member 84 moves to the outer side in radial direction 87 in accordance with the rotation of rotating member 101. As described above, when wind-up drum 47 is mounted, gap 119 is formed between rotating member 101 and outer circumferential surface 115A to facilitate the mounting. As described later, gap 119 is not formed by pressing wound member 84 on the inner side in radial direction 87 by wound cover tape 63. Therefore, in an initial state of the mounting in which cover tape 63 is not wound, gap 119 is formed, and the rotational force of support member 111 may not be efficiently transmitted to wind-up drum 47.

Each of three wound members 84 of the present embodiment is provided with magnet 109. Wind-up drum 47 maintains the rotational position (relative position) of circumferential direction 85 with respect to support member 111 by the magnetic attraction force of magnet 109 and metal plate 117. As a result, the rotational force of support member 111 can be efficiently transmitted to wind-up drum 47 by magnet 109 and metal plate 117 even in a state in which the fastening force capable of forming gap 119 is weak.

Accordingly, support member 111 of the present embodiment includes metal plate 117. Wind-up drum 47 includes magnet 109 that generates a magnetic attraction force with metal plate 117 when wind-up drum 47 is mounted on support shaft 115 to maintain the rotational position of wind-up drum 47 with respect to support shaft 115. According to this configuration, even in a state where cover tape 63 is not wound and cover tape 63 is not tightened with respect to wound member 84, it is possible to suppress the positional deviation of the rotational position of wind-up drum 47 with respect to support shaft 115 by magnet 109. Therefore, when wind-up drum 47 is attached to support shaft 115, the rotational position can be maintained by magnet 109 even if gap 119 is provided between wound member 84 and support shaft 115. In other words, gap 119 can be provided between wound member 84 and support shaft 115, and wind-up drum 47 can be easily attached to support shaft 115.

When the supply operation of electronic component 61 (refer to FIG. 4) by tape feeder 29 is started, wind-up drum 47 rotates in accordance with the rotation of support member 111 to wind cover tape 63 from carrier tape 59. By applying a constant tension to cover tape 63 and winding the same, wound member 84 is applied with a force to tighten the inner side in radial direction 87 by wound carrier tape 59. Gap 119 is not formed, and rotating member 101 brings curved surface 107 into contact (pressed) with outer circumferential surface 115A of support shaft 115. Wound member 84 is tightened by cover tape 63 from the outer side in radial direction 87, and is fixed to a predetermined slide position in radial direction 87 by bringing rotating member 101 on the inner side in radial direction 87 into contact with support shaft 115.

As described above, support shaft 115 of the present embodiment is a prism formed with outer circumferential surface 115A that comes into contact with rotating member 101 provided on each of multiple wound members 84 in a plane. According to this configuration, the rotational force of support shaft 115 can be efficiently transmitted to wind-up drum 47 by outer circumferential surface 115A.

Next, an operation when wind-up drum 47 is detached from support member 111 will be described. In the state illustrated in FIG. 8, wind-up drum 47 is in a state in which cover tape 63 is wound on outer circumferential surface 84A of wound member 84 so as to overlap in radial direction 87 (refer to FIG. 9). When wind-up drum 47 is moved toward the distal end side in the axial direction in this state, since curved surface 107 is brought into contact with outer circumferential surface 115A by the tightening force of cover tape 63, rotating member 101 rotates while bringing curved surface 107 into contact with outer circumferential surface 115A. For example, as indicated by arrows in FIG. 9, rotating member 101 rotates in the clockwise direction about a rotation axis along a direction orthogonal to the paper surface in FIG. 9. As a result, even in a state in which wound cover tape 63 is fastened, by rotating the rotating member 101 while bringing curved surface 107 into contact with outer circumferential surface 115A, wind-up drum 47 can be smoothly moved with respect to support shaft 115 to easily detach wind-up drum 47.

Figure 9:
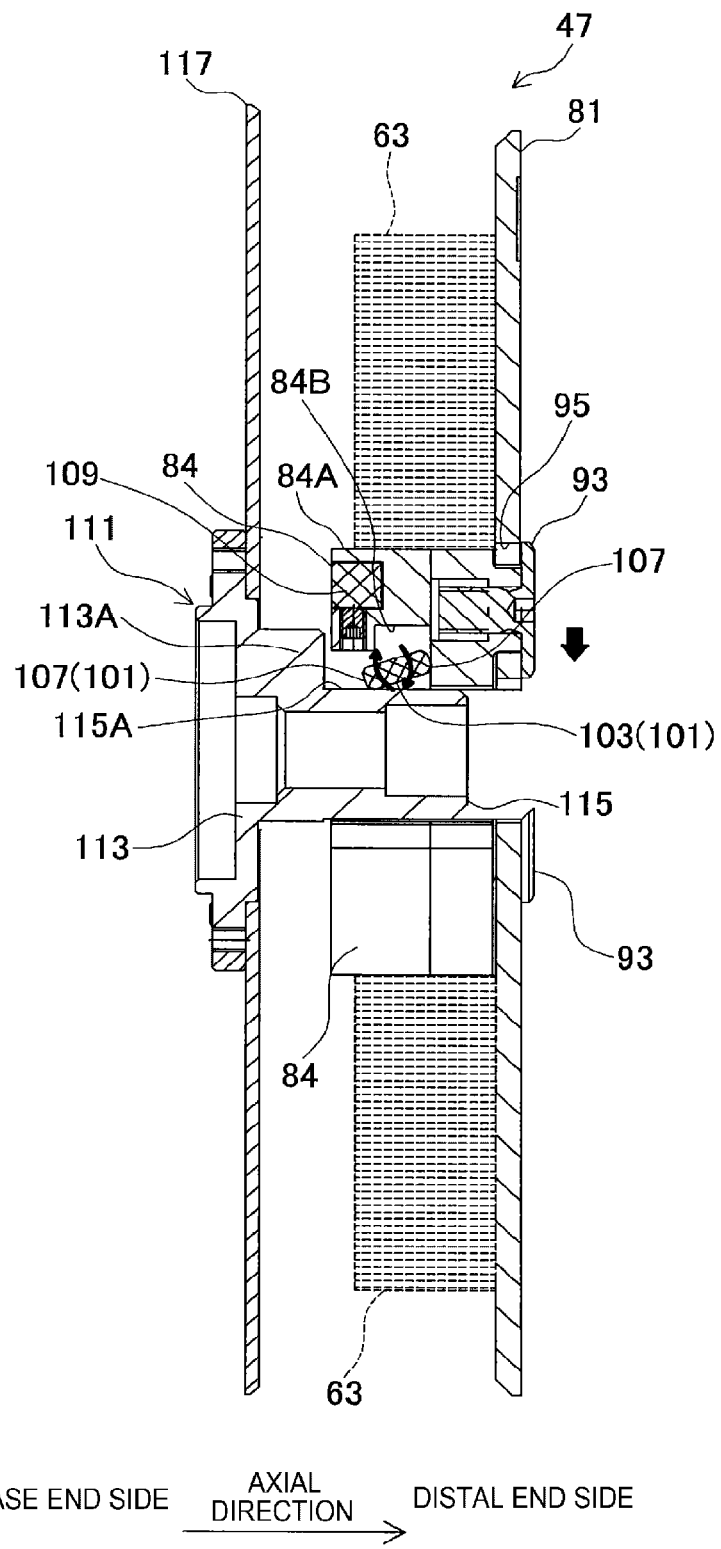
FIG. 9 is a sectional view illustrating a state of detaching the wind-up drum by cutting the support member and the wind-up drum in a plane along the axial direction.

Rotating member 101 is rotated to be in an inclined state, and rotates from a state of bringing curved surface 107 into contact with outer circumferential surface 115A to a state of bringing flat surface 103 to face outer circumferential surface 115A. As illustrated in FIG. 9, rotating member 101 is in a state in which one flat surface 103 of two flat surfaces 103 is directed toward outer circumferential surface 115A (inclined to face the lower side of FIG. 9). Outer curved surface 107 in radial direction 87 is apart from the inner wall of wound member 84 on the inner side in radial direction 87. Wound member 84 moves to the inner sider in radial direction 87 in accordance with the rotation of rotating member 101 (refer to arrows in FIG. 9). The rotational range of rotating member 101 is limited so that rotating member 101 is rotatable within a predetermined range from the rotational position illustrated in FIG. 8 to the rotational position illustrated in FIG. 9, for example. Rotating member 101 may have a structure to be freely rotatable by 360 degrees. The rotational position of rotating member 101 illustrated in FIG. 9 is an example. For example, rotating member 101 may rotate to a state in which outer circumferential surface 115A and flat surface 103 are parallel to each other (to a state of facing each other with a gap) or a state in which outer circumferential surface 115A and flat surface 103 are brought into contact with each other.

Accordingly, wound member 84 of the present embodiment winds cover tape 63 while overlapping the same in radial direction 87 with the rotation of support shaft 115. Wound member 84 is configured to move in radial direction 87, which is a direction toward the rotational center of tape holding member 81, and moves to the inner side in radial direction 87 by an external force applied from cover tape 63 in accordance with the rotational position of rotating member 101. According to this configuration, by moving wound member 84 to the inner side in radial direction 87, the axial diameter (radius) of wound member 84 (core section 83) can be shortened. As a result, the fastening of cover tape 63 with respect to wound member 84 can be loosened. Therefore, wind-up drum 47 can be easily detached from support shaft 115.

In addition, multiple wound members 84 are disposed (three in the present embodiment) at predetermined intervals 86 (refer to FIG. 6) in circumferential direction 85, which is a direction in which cover tape 63 is wound. According to this configuration, the multiple wound members 84 can be moved in conjunction with each other (simultaneously) to the inner side in radial direction 87 in accordance with the rotational position of rotating member 101. The axial diameter of core section 83 can be uniformly and greatly shortened, and the fastening of cover tape 63 with respect to wound member 84 can be effectively loosened. In particular, three wound members 84 of the present embodiment are disposed at the same rotational angle (every 120 degrees) in circumferential direction 85. Therefore, it is possible to shorten the axial diameter of core section 83 more uniformly (while suppressing the variation in circumferential direction 85).

In addition, rotating member 101 includes curved surface 107 that comes into contact with support shaft 115, and flat surface 103 that is formed by being connected to curved surface 107 and disposed apart from support shaft 115 in a state in which curved surface 107 is brought into contact with support shaft 115. When detached from support shaft 115, rotating member 101 rotates while bringing curved surface 107 into contact with support shaft 115, and flat surface 103 is directed toward support shaft 115.

According to this configuration, rotating member 101 brings curved surface 107 into contact with support shaft 115 while separating flat surface 103 from support shaft 115 (refer to FIG. 8). When wound member 84 is detached from support shaft 115, rotating member 101 rotates while bringing curved surface 107 into contact with support shaft 115, and flat surface 103 is directed toward support shaft 115. As a result, when rotating member 101 is rotated to a predetermined rotational position, a gap can be formed between flat surface 103 and support shaft 115, that is, between rotating member 101 and support shaft 115. The fastening of cover tape 63 with respect to wound member 84 can be loosened, and wind-up drum 47 can be easily detached from support shaft 115.

In addition, tape feeder 29 of the present embodiment includes support shaft 115 on which wind-up drum 47 is mounted, and support member 111 having pedestal member 113 that supports support shaft 115. In this configuration, in tape feeder 29 that supports wind-up drum 47 by support member 111, wind-up drum 47 can be easily detached.

In the above embodiment, pallet 24 is an example of the feeder mounting device. Head section 25 is an example of the mounting head. Cover tape 63 is an example of the tape. Support member 111 and electromagnetic motor 112 are examples of the rotating device.

As described above, according to the present embodiment described above, the following advantageous effects can be achieved. In one aspect of the present embodiment, wound member 84 of wind-up drum 47 includes rotating member 101 that rotates by bringing curved surface 107 into contact with support shaft 115 when cover tape 63 is detached from support shaft 115 in a state in which cover tape 63 is wound. Wind-up drum 47 is mounted on support shaft 115 in a state in which support shaft 115 is inserted into insertion hole 81A of tape holding member 81. Wind-up drum 47 winds cover tape 63 around wound member 84 by rotating support shaft 115 by electromagnetic motor 112. Rotating member 101 rotates in contact with outer circumferential surface 115A when wind-up drum 47 is detached from support shaft 115. As a result, even if cover tape 63 is fastened to wound member 84 and wound member 84 is fastened to support shaft 115 by cover tape 63, rotating member 101 is rotated, wind-up drum 47 is easily moved smoothly with respect to support shaft 115. Therefore, wind-up drum 47 can be easily detached from support shaft 115.

Figure 10:
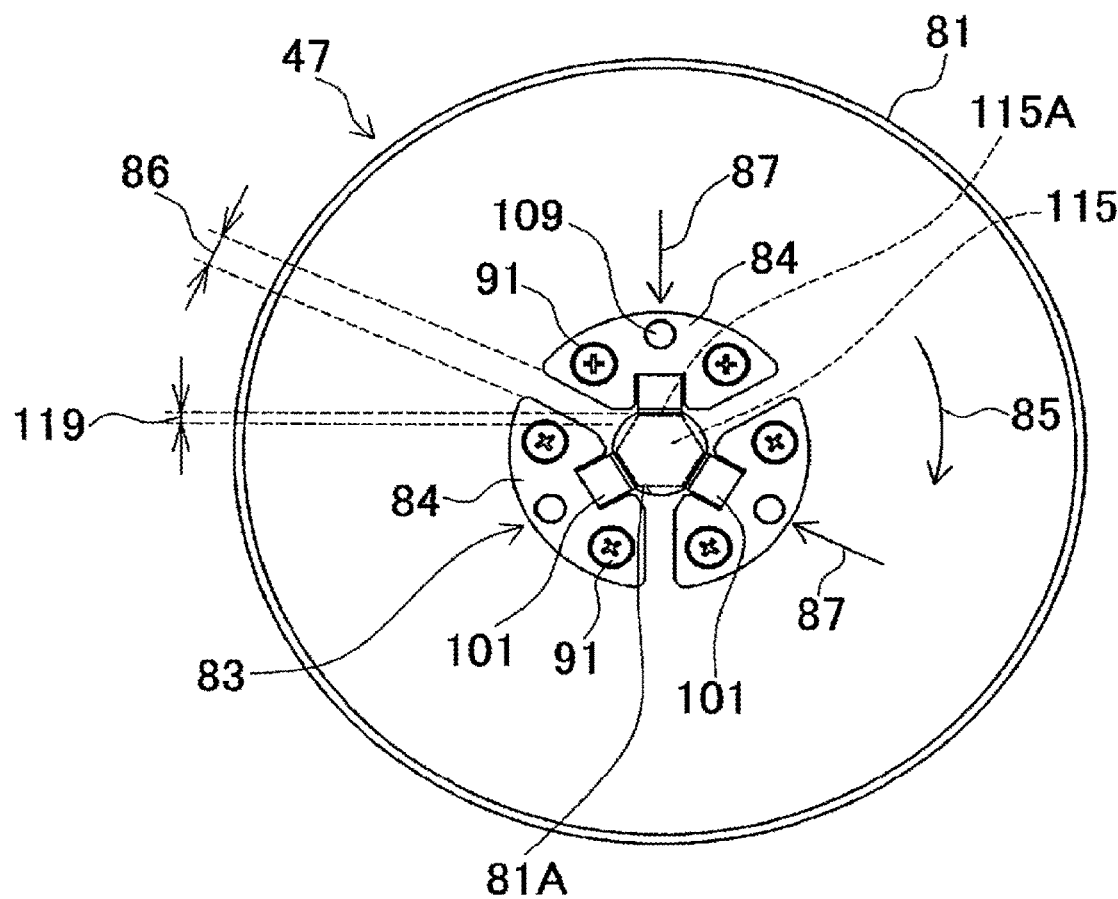
FIG. 10 is a plan view illustrating an inner side of a wind-up drum according to another example.

The content of the present disclosure is not limited to the above embodiment, but can be implemented in various manners in which various changes and improvements are made based on the knowledge of a person skilled in the art. For example, tape feeder 29 may include a driving source (such as a spring) other than electromagnetic motors 67 and 112. The shape of support shaft 115 is not limited to a triangular prism, and may be four or more polygonal prisms. For example, as illustrated in FIG. 10, support shaft 115 may be a hexagonal prism having outer circumferential surface 115A that comes into contact with rotating member 101 in a plane. In addition, support shaft 115 is not limited to a polygonal prism, and may be a cylinder or the like.

In addition, wound member 84 including rotating member 101 may be one. In addition, wound member 84 may have a configuration in which wound member 84 cannot slide in radial direction 87. Also in this case, by rotating the rotating member 101, wind-up drum 47 can be relatively easily detached from support member 111. In addition, core section 83 may be a single member having a cylindrical shape that is not divided into multiple wound members 84. The shape of rotating member 101 is not particularly limited. For example, rotating member 101 may be a mere sphere, may have a structure including multiple curved surfaces 107 having different curvatures, or may be a rectangular parallelepiped surrounded by flat surface 103. In addition, wound member 84 may not include magnet 109. In addition, support member 111 may not include metal plate 117. The tape feeder including the wind-up drum of the present disclosure is not limited to cassette-type tape feeder 29 that is automatically replaced by loader 13 as in the above embodiment. For example, the wind-up drum of the present disclosure can be mounted on a tape feeder that is manually unlocked and replaced by a human. In addition, the wind-up drum of the present disclosure is not limited to wind-up drum 47 that winds cover tape 63 of component supply tape 51 accommodating electronic component 61, but can also be applied to a wind-up drum that winds another tape. Accordingly, the wind-up drum of the present disclosure can be used for winding various tapes.

REFERENCE SIGNS LIST

10: component mounting system
20: component mounting machine
24: pallet (feeder mounting device)
25: head section (mounting head)
29: tape feeder
47: wind-up drum
63: cover tape (tape)
112: electromagnetic motor (rotating device)
84: wound member
86: interval
87: radial direction
81: tape holding member
81A: insertion hole
86: interval
101: rotating member
103: flat surface
107: curved surface
111: support member (rotating device)
112: electromagnetic motor (rotating device)
113: pedestal member
115: support shaft
115A: outer circumferential surface
117: metal plate

The invention claimed is:

1. A wind-up drum comprising:
a tape holding member including an insertion hole for inserting a support shaft of a rotating device and configured to hold a wound tape; and
a wound member attached to the tape holding member, configured to wind up the tape by rotating the support shaft by the rotating device in a state in which the support shaft is mounted, and including a rotating member that rotates in contact with the support shaft when the wound member is detached from the support shaft in a state in which the tape is wound.

2. The wind-up drum according to claim 1, wherein
the wound member is configured to move in a radial direction that is a direction toward a rotational center of the tape holding member, and moves to an inner side in the radial direction by an external force applied from the tape in accordance with a rotational position of the rotating member.

3. The wind-up drum according to claim 2, wherein
multiple wound members are disposed at predetermined intervals in a circumferential direction that is a direction in which the tape is wound.

4. The wind-up drum according to claim 1, wherein
the rotating member includes a curved surface that comes into contact with the support shaft, and a flat surface that is formed by being connected to the curved surface and disposed apart from the support shaft in a state in which the curved surface is brought into contact with the support shaft, rotates while bringing the curved surface into contact with the support shaft when the wound member is detached from the support shaft, and directs the flat surface toward the support shaft.

5. A tape feeder comprising:
the support shaft on which the wind-up drum according to claim 1 is mounted; and
the rotating device including a pedestal member that supports the support shaft.

6. The tape feeder according to claim 5, wherein
the pedestal member comes into contact with the rotating member when the wind-up drum is mounted on the support shaft to rotate the rotating member to a predetermined mounting position.

7. The tape feeder according to claim 5, wherein
multiple wound members are provided in a circumferential direction that is a direction in which the tape is wound, and
the support shaft is a prism having an outer circumferential surface that comes into contact in a plane with the rotating member provided on each of the multiple wound members.

8. The tape feeder according to claim 5, wherein
the rotating device includes a metal plate, and
the wind-up drum includes a magnet that generates a magnetic attraction force with the metal plate when the wind-up drum is mounted on the support shaft to maintain a rotational position of the wind-up drum with respect to the support shaft.

9. A component mounting machine comprising:
a feeder mounting device configured to attach and detach the tape feeder according to claim 5; and
a mounting head, wherein
the tape is a component supply tape that accommodates electronic components at predetermined pitches, and
the mounting head mounts the electronic components supplied from the tape feeder.

* * * * *